United States Patent
Seeber et al.

(10) Patent No.: US 7,436,180 B2
(45) Date of Patent: Oct. 14, 2008

(54) GRADIENT COIL APPARATUS AND METHOD OF FABRICATING A GRADIENT COIL TO REDUCE ARTIFACTS IN MRI IMAGES

(75) Inventors: Derek A. Seeber, Florence, SC (US); Weijun Yin, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 108 days.

(21) Appl. No.: 11/538,662

(22) Filed: Oct. 4, 2006

(65) Prior Publication Data

US 2008/0084209 A1 Apr. 10, 2008

(51) Int. Cl.
*G01V 3/00* (2006.01)
(52) U.S. Cl. ....................................... 324/318
(58) Field of Classification Search .............. 324/318
See application file for complete search history.

(56) References Cited

U.S. PATENT DOCUMENTS

| | | | |
|---|---|---|---|
| 5,235,283 A | | 8/1993 | Lehne et al. |
| 5,349,744 A | * | 9/1994 | Takahashi ............... 29/602.1 |
| 6,311,389 B1 | * | 11/2001 | Uosaki et al. ............ 29/605 |
| 2005/0032353 A1 | * | 2/2005 | Cheng et al. ............ 438/624 |
| 2006/0252260 A1 | * | 11/2006 | Yamazaki et al. ...... 438/640 |
| 2006/0269674 A1 | | 11/2006 | Schuster et al. |

FOREIGN PATENT DOCUMENTS

| | | |
|---|---|---|
| EP | 1850145 | 10/2007 |
| JP | 2005346981 | 12/2005 |

OTHER PUBLICATIONS

GB Search Report dated Jan. 10, 2008.

* cited by examiner

*Primary Examiner*—Brij B. Shrivastav
*Assistant Examiner*—Megann E Vaughn

(57) ABSTRACT

A gradient coil or other element of a magnetic resonance imaging system includes at least one layer comprised of copper having a first surface and a second surface. A first semiconductor layer is applied to the first surface of the copper and an insulation layer applied to the first semiconductor layer. In one embodiment, a second semiconductor layer is applied to the second surface of the copper. The first and second semiconductor layers encapsulate any voids formed between the copper and the semiconductor layers, equalize the potential around the voids and prevent partial discharge formation.

18 Claims, 4 Drawing Sheets

GRADIENT COIL APPARATUS AND METHOD OF FABRICATING A GRADIENT COIL TO REDUCE ARTIFACTS IN MRI IMAGES

FIELD OF THE INVENTION

The present invention relates generally to magnetic resonance imaging (MRI) systems and in particular to a gradient coil and a method of fabricating a gradient coil to reduce artifacts in MRI images.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

Each gradient coil used in an MRI system, or other elements in the MRI system, may consist of a plurality of layers including conducting copper sheets or boards and insulation layers (e.g., an epoxy resin). FIG. 1 is an exemplary prior art laminate stack for a gradient coil. The gradient coil stack 100 includes a copper sheet or board 102, a laminate 106 (e.g., a fiberglass substrate) that is used as a backing for copper 102, and an insulation coating such as epoxy resin 104. The copper sheet 102 may be etched with a pattern or trace (e.g., a "fingerprint" pattern). Various processes, such as lamination or vacuum pressure impregnation (VPI), may be used during the manufacture or fabrication of the gradient coil 100. For example, in one fabrication process, the copper sheet 102 is laminated directly to the laminate 106. The entire board may then be impregnated with epoxy resin 104 using a VPI process. For example, the resin 104 may be injected into a mold (while the mold is under a vacuum) that forms the shape of the gradient coil.

During fabrication of the gradient coil, voids may form at an interface 120 between the copper 102 and the resin 104, at an interface 122 between the copper 102 and the laminate 106, in the resin 104, or in the laminate 106. For example, a void 108 is shown in FIG. 1 in the resin 104 at the interface between the copper 102 and resin 104. There are several possible sources of void formation in a gradient coil. One source of void formation is poor bonding/bonding strength between the copper 102 and the epoxy resin 104 or between the copper 102 and the laminate 106. For example, typically the epoxy resin does not bond well to an inorganic metal. Another source of void formation are leaks in the mold used for vacuum pressure impregnation of the epoxy resin 104. Leaks in the mold may form bubbles inside the VPI epoxy resin. In addition, incomplete coverage (e.g., delamination) during pressing of the copper 102 and laminate 106 is another possible source of voids.

Any voids that form in the gradient coil, e.g., void 108 shown in FIG. 1, are susceptible to partial discharges. An electric field is induced in a void and at a partial discharge inception voltage (PDIV), the voltage difference across the void causes a small spark (or partial discharge) to bridge the void. The spark or partial discharge causes a radio frequency (RF) noise burst to be emitted. The MRI system can detect the RF noise burst which will cause artifacts in the MRI image generated by the MRI system. For example, a partial discharge in a gradient coil may yield an effect in k-apace known as a "white pixel." The "white pixel" produces an artifact in the reconstructed MR image making an image undesirable and difficult to interpret.

Accordingly, there is a need for a gradient coil and method of fabricating a gradient coil that reduces the number of voids and reduces or eliminates the partial discharge in voids that are formed in the gradient coil. In addition, it would be desirable to provide a gradient coil and method of fabricating a gradient coil that improves the bonding of the copper to an insulation layer and the bonding of the copper and to the fiberglass substrate. It would be also advantageous to provide a method of eliminating the field generation across a void in an MRI system by equalizing the potential difference across the void.

BRIEF DESCRIPTION OF THE INVENTION

In accordance with an embodiment, a gradient coil for a magnetic resonance imaging system includes at least one layer comprised of a copper sheet having a first surface and a second surface, a first semiconductor layer applied to the first surface of the copper sheet, and an insulation layer applied to the first semiconductor layer.

In accordance with another embodiment, a method for fabricating a gradient coil for a magnetic resonance imaging system, the method includes applying a first semiconductor layer to a first surface of a copper sheet, applying a second semiconductor layer to a second surface of the copper sheet, applying a fiberglass substrate layer to the second semiconductor layer, and applying an insulation layer to the first semiconductor layer.

In accordance with another embodiment, a magnetic resonance imaging system includes at least one copper surface, at least one semiconductor layer applied to the at least one copper surface and an insulation layer applied to the at least one semiconductor layer.

BRIEF DESCRIPTION OF THE DRAWINGS

The invention will become more fully understood from the following detailed description, taken in conjunction with the accompanying drawings, in which.

DETAILED DESCRIPTION

Figure 1:
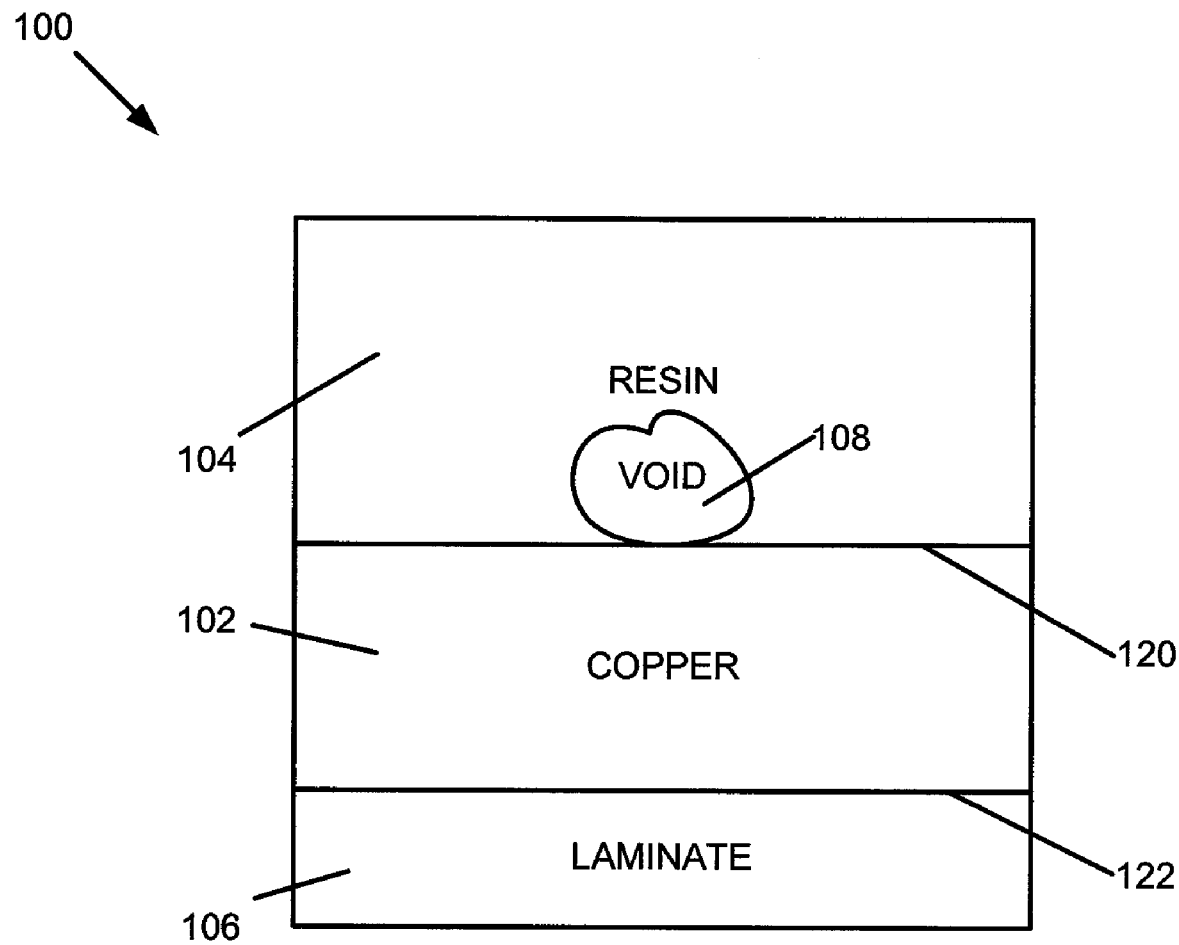
FIG. 1 is an exemplary prior art laminate stack for a gradient coil.
Figure 2:
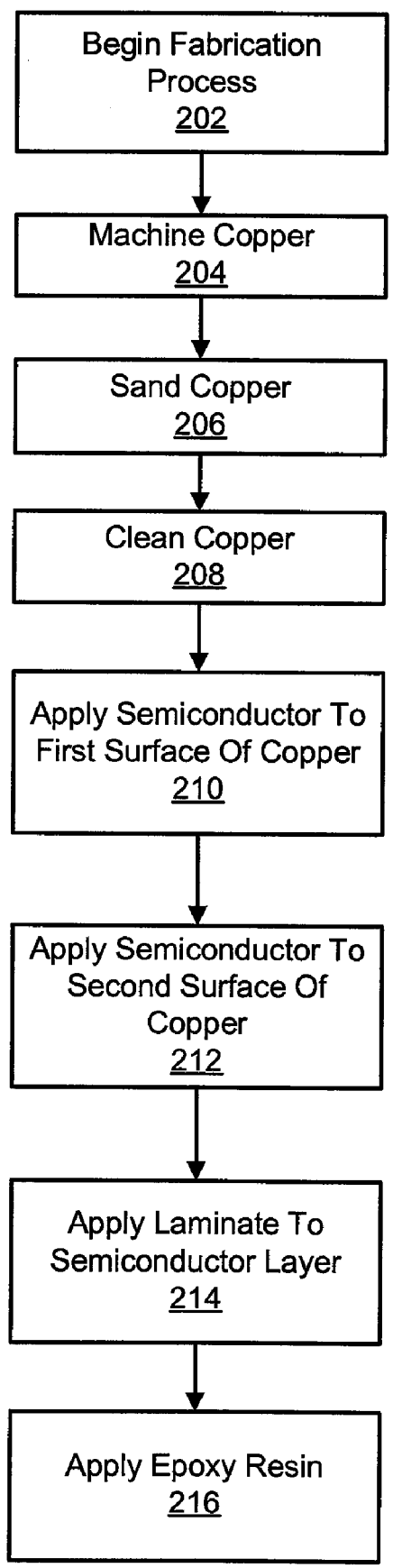
FIG. 2 illustrates a method of fabricating a gradient coil in accordance with an embodiment.

FIG. 2 illustrates a method of fabricating a gradient coil in accordance with an embodiment. At block 202, the fabrication process begins. At block 204, a copper sheet or board is machined. During machining, the copper sheet may be etched to include a pattern or trace, for example, a "fingerprint" trace. At block 206, the copper may be sanded to roughen the surface of the copper to promote adhesion. At block 208, the copper may be cleaned to remove, foe example, grease and dust. At block 210, a first layer of a semiconductor material is applied to a first surface of a copper sheet or board. For example, the semiconductor may be applied to a top surface of the copper sheet. In alternative embodiments, the copper may be in the form of a solid round copper conductor, a hollow conductor, or wire(s). In such embodiments, the semiconductive material may be applied as a coating or as a tape wrapped around the copper conductor. At block 212, a layer of the semiconductor material is applied to a second surface of the copper sheet or board. For example, the semiconductor may be applied to a bottom surface of the copper sheet. The semiconductor may be, for example, conductive epoxy black or other semiconductor material. Alternatively, a conductive epoxy, metal filled resin (e.g., a metal filled polymeric resin) or other materials that are poor conductors may be used instead of the semiconductor. In one embodiment, the semiconductor may be laminated to the first and second surface of the copper sheet. Methods of lamination generally known in the art may be used to apply the semiconductor layers. Alternatively, the semiconductor may be applied, for example, as a wound tape, by solution coating, or as an adhesive tape.

At block 214, a laminate backing is laminated to a layer of the semiconductor, for example, to the semiconductor layer applied to the bottom surface of the copper sheet. The laminate and semiconductor layer are bonded at a first laminate surface, e.g., a top surface of the laminate. The laminate may be, for example, an FR4 fiberglass substrate, plastic, teflon, etc. In another embodiment, a third semiconductor layer may be applied (e.g., laminated) to a second laminate surface, e.g., a bottom surface of the laminate. Methods of lamination generally known in the art may be used to apply the laminate.

Figure 3:
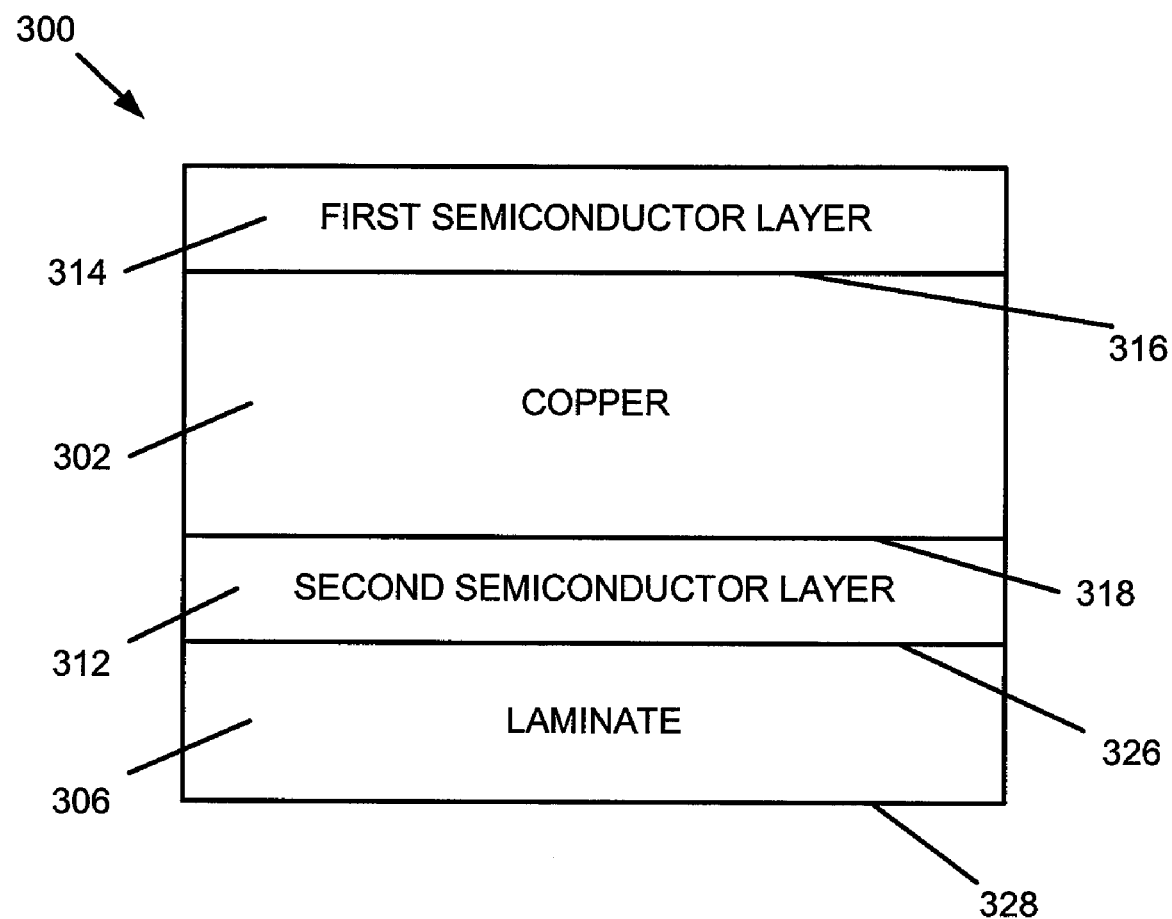
FIG. 3 is a schematic block diagram of a gradient coil laminate stack in accordance with an embodiment.

FIG. 3 is a schematic block diagram of a gradient coil laminate stack in accordance with an embodiment. In FIG. 3, a first semiconductor layer 314 is applied to a first surface 316 of a copper sheet 302 and a second semiconductor layer 312 is applied to a second surface 318 of the copper sheet 302. A laminate 306 (e.g., a fiberglass substrate) is laminated, for example, a first laminate surface 326, to the second semiconductor layer 312. The first and second semiconductor layers 312, 314 are preferably epoxy doped or an organic coating so that it will bond well to the epoxy resin used to encapsulate the gradient coil laminate board 300 as described further below. Improved bonding may prevent the formation of voids. In addition, any voids that do form between the copper surface and the semiconductor will be contained within the semiconductor layer. In another embodiment, a third semiconductor layer (not shown) may be applied (e.g., laminated) to a second laminate surface 328. The third semiconductor layer (not shown) is electrically coupled to the copper 302, for example, the third semiconductor layer may be wrapped around at the ends to be coupled to the copper. Voids that form between the semiconductor and the laminate or in the laminate are encapsulated by the semiconductor.

As discussed above, in alternative embodiments, the copper conductor 302 may be a solid round copper conductor, a hollow conductor, or wire(s). A semiconductor layer may be applied as a coating or as a semiconductor tape wrapped around the copper conductor. In addition, a conductive epoxy or metal filled resin may be used instead of a semiconductor material.

Returning to FIG. 2, at step 216, an insulation layer, e.g., an epoxy resin is applied to the gradient coil laminate stack. In one embodiment, the epoxy resin may be applied using vacuum pressure impregnation (VPI). VPI methods generally known in the art may be used to apply the epoxy resin. In alternative embodiments, the epoxy resin may be applied using resin infusion molding, resin transfer molding, vacuum assisted resin transfer molding or lamination. A laminate stack including the epoxy resin is shown in FIG. 4.

Figure 4:
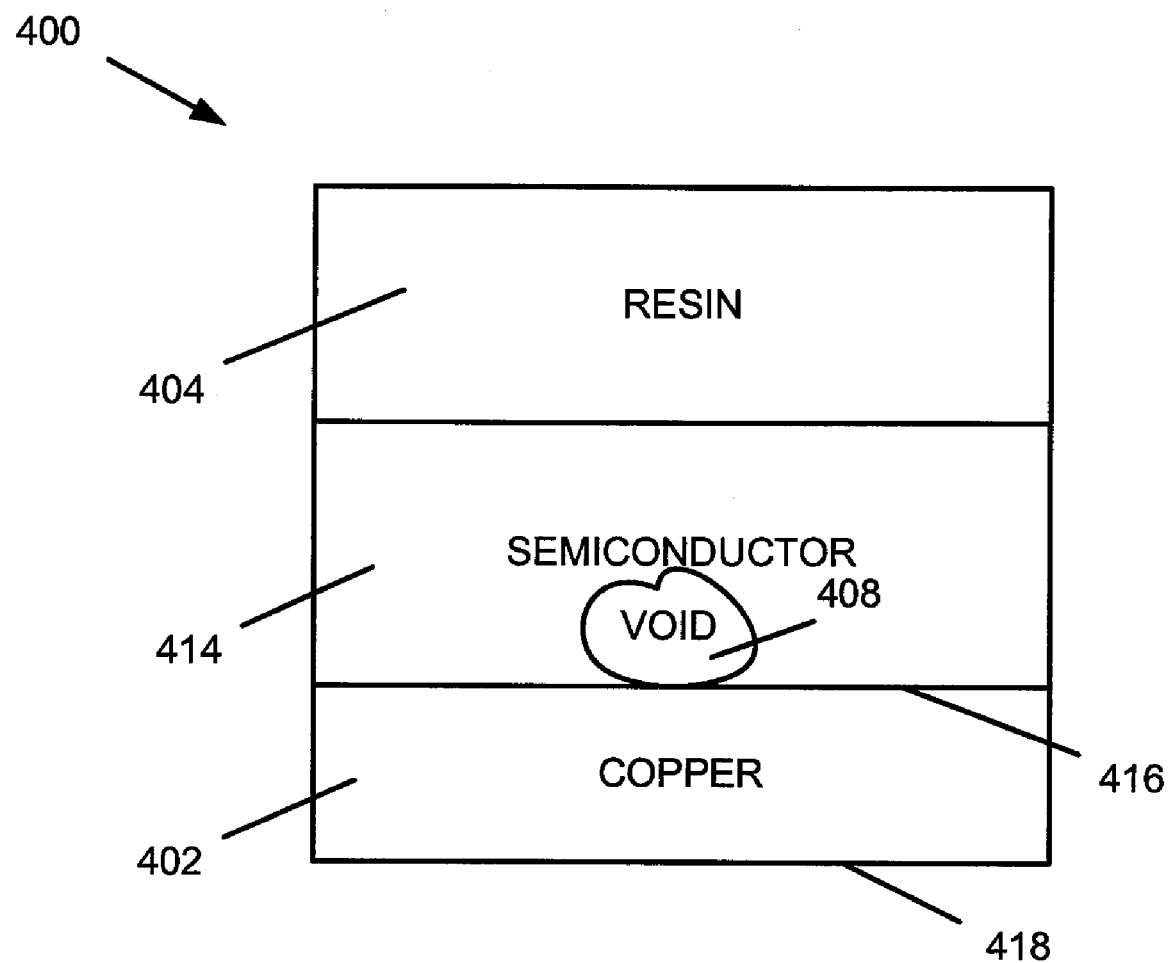
FIG. 4 is a schematic block diagram of a gradient coil laminate stack including a void in accordance with an embodiment.

FIG. 4 is a schematic block diagram of a gradient coil laminate stack including a void in accordance with an embodiment. As mentioned, a semiconductor layer 414 is applied to a first surface 416 of the copper 402 before application of an epoxy resin 404 or other insulation layer (e.g., by VPI). The semiconductor layer 414 is located between the copper 402 and the resin 404. As discussed above with respect to FIG. 2, a second semiconductor layer (not shown) may be applied to a second surface 418 of the copper 402. Any voids, e.g., void 408, that form between the copper 402 and the semiconductor 414 during fabrication (e.g., during a lamination process) are contained within the semiconductor layer 414. Semiconductor 414 encapsulates void 408 and acts as an equipotential surface. The semiconductor 414 will keep the void at the same potential (i.e., the semiconductor will equalize the potential around any voids, e.g., void 408, between the copper 402 and the semiconductor 414) due to the small conductivity of the semiconductor. Accordingly, an electric field will not form across the void 408 preventing a partial discharge from occurring in void 408. By applying a semiconductor layers or layers to the surface(s) of the copper sheet, any voids formed between the copper and the semiconductor will be encapsulated in an equipotential volume which will eliminate or reduce the potential difference across the void and prevent partial discharge formation. In addition, by applying a semiconductor layers or layers to the surface(s) of the laminate (not shown), for example, a fiberglass substrate, any voids formed between the laminate and the semiconductor will be encapsulated in an equipotential volume which will eliminate or reduce the potential difference across the void and prevent partial discharge formation.

In other embodiments, a semiconductor layer or layers may be applied to other copper surfaces in the MRI system that are insulated with a material such as epoxy resin to reduce or prevent partial discharge formation. The reduction or elimination of partial discharges will in turn reduce or prevent artifacts being generated in an MRI image.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A gradient coil for a magnetic resonance imaging system, the gradient coil comprising:
    at least one layer comprised of copper having a first surface and a second surface;
    a first semiconductor layer applied to the first surface of the copper; and
    an insulation layer applied to the first semiconductor layer.

2. A gradient coil according to claim 1, wherein the copper is formed as one of a sheet, a solid round conductor, a hollow conductor or a wire.

3. A gradient coil according to claim 1, wherein the copper comprises an etched pattern on the first surface of the copper.

4. A gradient coil according to claim 1, further comprising:
    a second semiconductor layer applied to the second surface of the copper.

5. A gradient coil according to claim 4, further comprising:
    a laminate layer applied to the second semiconductor layer.

6. A gradient coil according to claim 5, wherein the laminate layer is laminated to the second semiconductor layer.

7. A gradient coil according to claim 5, wherein the laminate layer has a first laminate surface and a second laminate surface and the first laminate surface is coupled to the second semiconductor layer, the gradient coil further comprising:
    a third semiconductor layer applied to the second laminate surface of the laminate layer and electrically coupled to the copper.

8. A gradient coil according to claim 4, wherein the second semiconductor layer is laminated to the second surface of the copper.

9. A gradient coil according to claim 1, wherein the insulation layer is an epoxy resin.

10. A gradient coil according to claim 1, wherein the first semiconductor layer is laminated to the first surface of the copper.

11. A gradient coil according to claim 1, wherein the insulation layer is vacuum pressure impregnated.

12. A gradient coil according to claim 1, wherein the first semiconductor layer is applied as a wound tape.

13. A method for fabricating a gradient coil for a magnetic resonance imaging system, the method comprising:
    applying a first semiconductor layer to a first surface of a copper layer;
    applying a second semiconductor layer to a second surface of the copper layer;
    applying a laminate layer to the second semiconductor layer; and
    applying an insulation layer to the first semiconductor layer.

14. A method according to claim 13, wherein applying the first semiconductor layer to a first surface of the copper layer comprises laminating the first semiconductor layer to the first surface of the copper layer.

15. A method according to claim 13, wherein applying a second semiconductor layer to a second surface of the copper layer comprises laminating the second semiconductor layer to the second surface of the copper layer.

16. A method according to claim 13, wherein applying a laminate layer to the second semiconductor layer comprises laminating the laminate layer to the second semiconductor layer.

17. A method according to claim 13, wherein applying an insulation layer to the first semiconductor layer comprises vacuum pressure impregnating the insulation layer.

18. A method according to claim 13, wherein the insulation layer is an epoxy resin.

* * * * *